United States Patent
Hsu et al.

(10) Patent No.: US 11,380,417 B1
(45) Date of Patent: Jul. 5, 2022

(54) CIRCUIT TO REDUCE GATING OVERALL SYSTEM PERFORMANCE

(71) Applicant: WESTERN DIGITAL TECHNOLOGIES, INC., San Jose, CA (US)

(72) Inventors: Cynthia Hsu, Fremont, CA (US); YenLung Li, San Jose, CA (US); Min Peng, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/338,595

(22) Filed: Jun. 3, 2021

(51) Int. Cl.
  *G11C 29/42* (2006.01)
  *G11C 7/10* (2006.01)
  *G11C 29/00* (2006.01)
  *G11C 29/18* (2006.01)

(52) U.S. Cl.
  CPC ............ *G11C 29/42* (2013.01); *G11C 7/1012* (2013.01); *G11C 29/18* (2013.01); *G11C 29/789* (2013.01)

(58) Field of Classification Search
  CPC ........ G11C 29/42; G11C 7/1012; G11C 29/18; G11C 29/789
  See application file for complete search history.

(56) References Cited

U.S. PATENT DOCUMENTS

| | | | | |
|---|---|---|---|---|
| 7,190,617 B1 * | 3/2007 | Harari | ............... | G11C 16/344 365/185.11 |
| 2020/0117610 A1 * | 4/2020 | Berger | ............... | G11C 11/1675 |

* cited by examiner

*Primary Examiner* — Han Yang
(74) *Attorney, Agent, or Firm* — ArentFox Schiff LLP

(57) ABSTRACT

Aspects of a storage device are provided that reduce calculations for identifying physical locations of data during a read operation. In one aspect, a memory device includes one or more memory arrays. Each array includes multiple chunks of memory. The device includes a first set of registers for storing prefixed starting addresses for each array. The device further includes control logic that may identify bad physical address in each array. For each successive chunk in each array and based on the prefixed starting address and the bad physical address locations, the device may determine a pointer to a starting physical address for the chunk. The pointer may be stored in a second set of registers for use in register read operations.

20 Claims, 9 Drawing Sheets

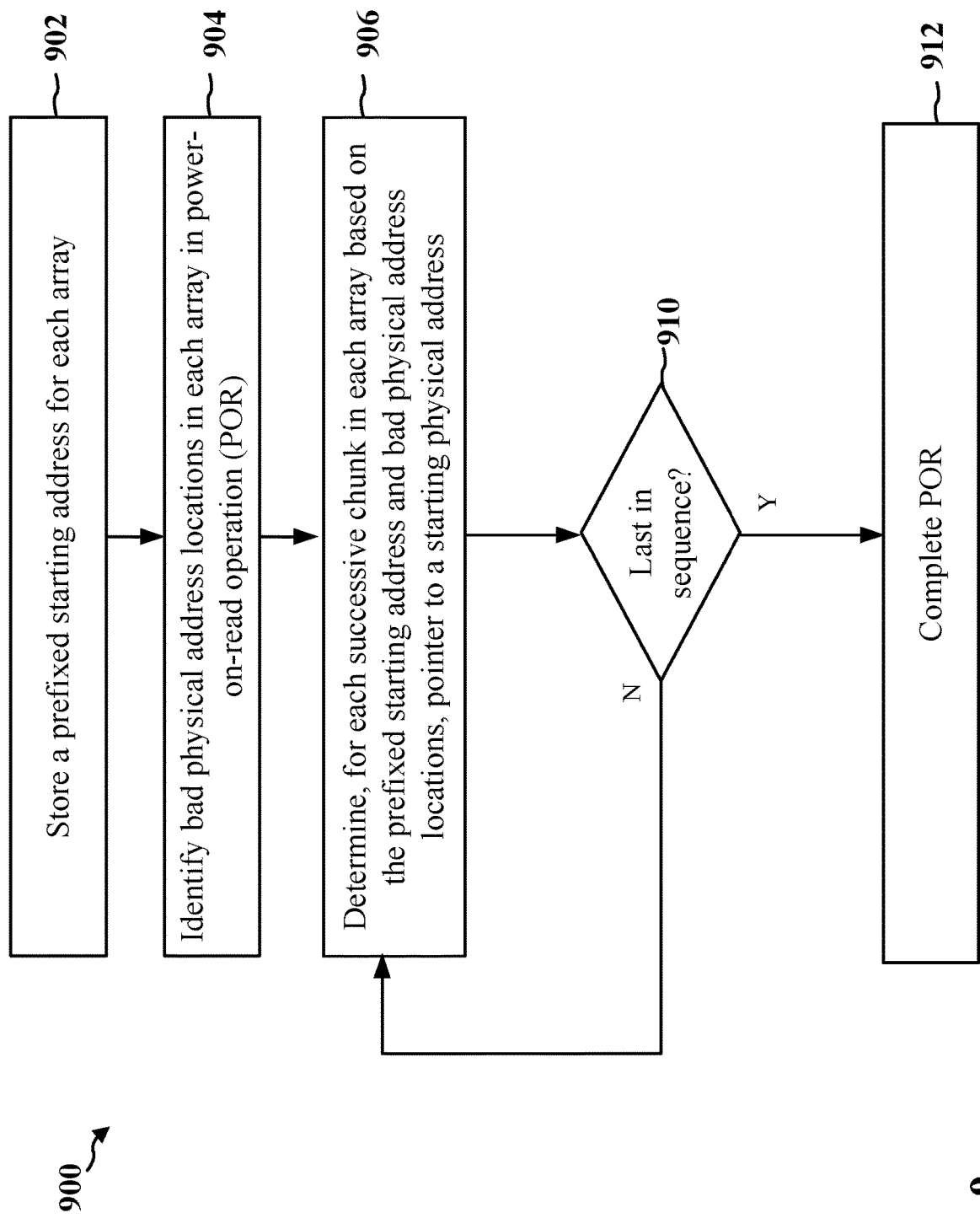

US 11,380,417 B1

CIRCUIT TO REDUCE GATING OVERALL SYSTEM PERFORMANCE

BACKGROUND

Field

This disclosure is generally related to electronic devices and more particularly to storage devices.

INTRODUCTION

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A host commonly issues register read instructions to retrieve data from data laches of a storage device (e.g., a NAND device, NOR device, etc.). The data latches may function as cache memory. For every register read instruction, the controller incurs timing overhead to enable the storage device to perform address translation. These calculations are needed to ensure that the storage device retrieves the data from physical memory locations corresponding to the requested logical addresses. Because this overhead is separately incurred for each register read operation, the overall timing penalty incurred by the storage device is cumulative, and progressively worsens with each additional read operation. This overhead places practical limits on maximum achievable data rates of the storage device.

SUMMARY

One aspect of a storage device is disclosed herein. A memory device includes one or more memory arrays. Each array includes a plurality of chunks. Each chunk includes a plurality of consecutive memory locations. The device also includes first registers configured to store a prefixed starting address for each chunk. The device further includes control logic. The control logic is configured, during a power-on-read (POR) operation, to identify bad physical address locations in each array, determine, for each chunk in an array based on the prefixed starting address and the bad physical address locations, a pointer to a starting physical address, and store the pointer in second registers for subsequent register read operations.

Another aspect of a storage device is disclosed. The storage device includes one or more memory planes each partitioned into consecutive blocks. Each block is arranged as sequential columns of memory cells having a starting address stored in first registers. The control logic is configured, during a power-on-read (POR) operation, to identify information comprising bad physical addresses in each plane, determine, for each block in each plane based on the corresponding starting address and the bad physical address information, a pointer to a memory location, and store the pointers in second registers for use with the starting addresses in register reads.

Another aspect of a storage device is disclosed. The storage device includes a plurality of consecutive memory chunks each arranged as columns of memory cells. The storage device also includes first registers configured to store an initial column address for each chunk. The storage device further includes control logic configured, during a power-on-read (POR) operation, to identify bad physical addresses in each chunk, retrieve, from the first registers for each successive chunk, the starting column address, determine a pointer to a memory location for the initial column address for each block, wherein at least some of the pointers are shifted based on the bad physical addresses, and store the pointers in second registers for use in register read operations.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIG. 9 is an exemplary flow diagram illustrating a memory pre-configuration for use in subsequent read operations.

DETAILED DESCRIPTION

Figure 1:
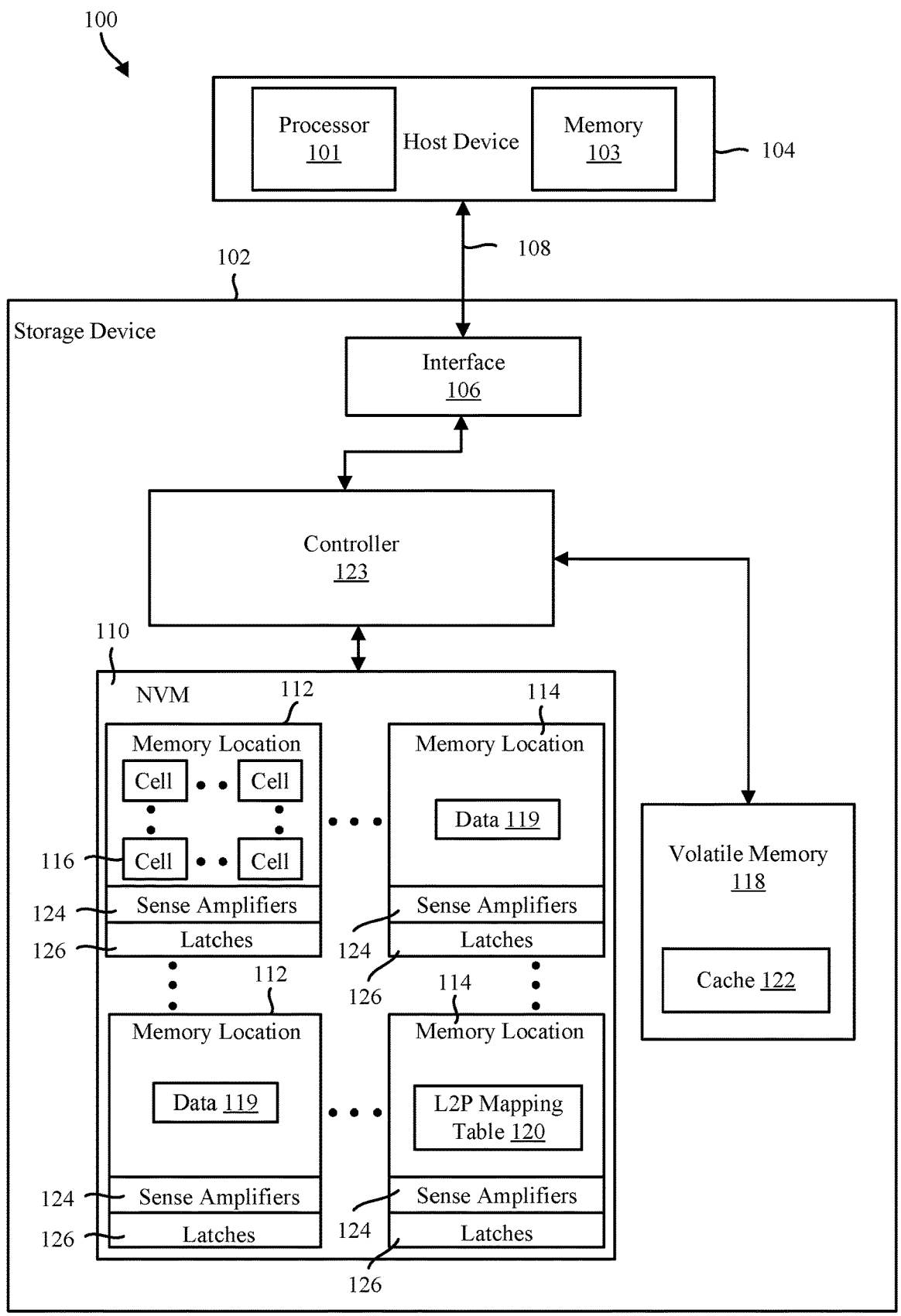
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

The present disclosure is directed to techniques that reduce timing overhead associated with register reads that occur in different types of storage dies, such as NAND dies and the like. Typical NAND storage devices include sense amplifiers coupled to (or including) one or more data latches. Generally, when data is read from cells in a memory location, the sense amplifiers sense the data by amplifying the voltages on the bit lines to a readable logic level. The sensed data is stored in the data latches 126. In addition, data written to the memory is transferred to the data latches for updating the associated memory cell(s). In this respect, the data latches may act as cache memory of the NAND flash memory, such that even if other portions of the NAND flash memory are still in use, the NAND flash memory can be ready to perform data operations provided the data latches (e.g., the XDL latches) are available.

A controller may use a register read instruction to read data from data latches. An exemplary register read instruction field is shown, in part using hexadecimal, below.

| 05h | A1 | A2 | A3 | A4 | A5 | A6 | E0h |
|---|---|---|---|---|---|---|---|

The first field in the exemplary register read instruction above represents the register read instruction itself followed by multiple address bytes. In this respect, the controller can read the data directly from the NAND's data latches. The A1 and A2 fields represent column addresses. A3 is a word line plane address. A4 are A5 are block addresses followed by the chip address A6. Following the E0 instruction in the field, a dedicated time period labeled twhr2 for exemplary purposes conventionally follows. The time period twhr2 may represent the conventional overhead corresponding to every register read instruction issued by the storage controller. For example, the time twhr2 conventionally corresponds to various timing limitations including, for example, the time to prefetch the data to populate the data path pipeline, and the time period needed by the NAND die after receiving the logical column addresses A1 and A2 to calculate the physical memory locations that correspond to the logical column addresses that accompany the read instruction, and to access the requested information from the data latches. It will be appreciated that the above instruction is exemplary in nature, and other storage devices may use different fields or instructions for performing register read operations. Further, as described in more detail below, the control circuits that perform different CRD-related functions, and the related data path, are typically shared among the planes, and multiplexing techniques can be used to selectively fetch different data values for use in different planes.

A major shortcoming associated with this incurred overhead is that, although technology fabrication techniques and geometries are such that I/O speeds are generally increasing each generation, the time period twhr2 is more or less fixed. Consequently, the required calculations are not scaling with the increased I/O speeds. As a result, the timing overheads are becoming an increasingly larger percentage of the overall data read time. These overheads also present a cumulative problem, as noted, in that currently, every register read operation incurs this additional time period.

Accordingly, in one aspect of the disclosure, the time period twhr2, and thus the overhead associated with identifying the applicable physical memory locations, is substantially reduced. In lieu of performing the physical calculations necessary to identify a physical column address location corresponding to the requested logical address, and doing so every time a register read operation is received from the storage controller, the necessary calculations to identify the physical locations of all the data in the caches may be performed in advance, during the initial power-on-read (POR) procedure. Performing these calculations in advance may equally apply to other types of storage devices that employ a procedure similar in substance to the POR. In one embodiment, during the POR, the bad physical addresses of the memory are identified. The bad addresses may be temporarily stored in some logical sequential order. As described in greater detail below, the storage device can use control logic to identify, for each chunk in each array of a storage device so configured, corresponding pointer values that identify the correct physical memory location corresponding to the logical column address. Rather than performing this procedure on the fly every time a register read is received, as is conventionally the case, the embodiments herein perform the necessary calculations a single time during POR. Subsequently, during normal operation of the storage device, when a user column arrives that matches a bad address, the control logic can output from a register a preexisting pointer that simply points to the next good address.

It is recognized that different types of non-volatile storage devices may use different designations for the partitioned sections of memory. For example, many NAND-based dies use planes, pages, blocks, words, etc. In some embodiments described herein, the disclosure may use the terminologies "array" and "chunk" to describe any number of different types of these segments. Thus, the terms "array" and "chunk" can broadly be used to refer to different physical or logical configurations of non-volatile memory. For example, in one such configuration, a storage device may partition its memory into a plurality of memory arrays, which may be defined sets of physical or logical memory locations. In this configuration, each array may include a corresponding chunk, which for purposes of this disclosure, may correspond to a physical or logical subset of the array. In short, these terms may broadly be used to encompass a number of different logical partitions that may be used by the various non-volatile storage devices, including flash storage devices.

For example, the NAND storage device, having partitioned each array (which may correspond to a plane or other physical or logical arrangement of memory) into a plurality of chunks (which, for purposes herein, may include blocks, pages, words, or some other specified amount of storage) per the described embodiments, may proceed to access a pre-fixed starting column address for each chunk. Based on the starting column address, the storage device uses a pointer as well as the number and location of bad physical address to allocate a physical memory location to each logical column address. For purposes of this disclosure, a pointer may be ascribed its ordinary meaning, which includes a logical construct that may correspond to a stored value, that in turn is associated with a physical location in memory.

Each chunk may correspond to a plurality of consecutively-arranged addressable columns in a larger array. In these types of configurations, it is expected that there will always be some bad or corrupt memory locations. Accordingly, it is natural for the manufacturer of the wafer and the corresponding die to include extra CRD columns that provide margin for these expected bad memory locations. These CRD locations enable the storage device to use the extra columns as addressable locations for storing data when a number of bad columns are identified during POR. In this configuration, the storage device, using CRD control logic (which may in different embodiments include use of dedicated logic or a more general purpose controller), may first wait for the bad columns (or physical memory locations) to be identified during a conventional step in the POR.

Thereafter, the control logic may access a first memory location in the chunk by referring to a corresponding pre-fixed starting address. If the pre-fixed starting address points to a bad physical location in memory as identified in the previous step, the control logic may step through the next consecutive memory locations to find the first functional memory location for the first chunk. The control logic can then assign a logical value to the first available physical memory location, e.g., in a column of memory locations. The first functional column address can be defined in one embodiment by a pointer, whose value can be offset corresponding to the number of bad column entries (if any) encountered before a functional column address is available. For example, if the pre-fixed starting address points to a bad column address for the first chunk, and there exist two additional bad memory locations consecutively following the first column address, after which follows a first functional memory location, the control logic may shift the pointer (from an arbitrary initial value, say zero (0), to include an offset of three (3). It should be noted that the decimal number three (3), or the pointer in general, may be represented in a variety of equivalent ways such as using a hexadecimal representation or otherwise, that will ultimately be configured in a binary manner compatible with the control logic.

Continuing with the above-example, the control logic of the storage device may refer to the next chunk in sequence in the same array. Based on the prefixed starting address corresponding to that memory location, the control logic may in one embodiment logically compare the starting address locations with the predetermined bad memory locations. Based on that comparison, the control logic may increment the pointer by the value one (1) for every bad memory location that is present in the preceding chunk. This action helps ensures that the preceding chunk is allocated the correct number of functional memory locations. With this information, the control logic can shift the pointer value can to point to the correct physical location in memory that accounts for the identified bad locations. In one embodiment, the chunk may be allocated four (4) Kilobytes plus some predetermined amount of error correction code (ECC) (along with any other reserved bits that may optionally be allocated for that chunk). The pointer value may be stored in a register. In sum, the prefixed starting address dedicated to that second sequential chunk will include a separate pointer identifying the correct offset address for that chunk.

In like manner during the POR, the control logic may proceed to the next chunk in the array corresponding to the next prefixed starting address in that array. The control logic may then shift the pointer for that chunk by an amount that provides an offset to the logical prefixed starting address that is the cumulative sum of the bad memory locations from the first two chunks. This procedure again ensures that the immediately preceding chunk in the array is also allocated with the correct number of functioning memory locations (e.g., another 4K data plus ECC). The control logic proceeds to the next chunk and performs a similar procedure. If the chunk is the final chunk in an array, the pointer is shifted to ensure that all chunks are allocated the correct number of working memory locations. Having stored all the pointers for that chunk, the control logic may proceed to the next array and may use the prefixed starting address as a basis to shift a pointer in the same manner. The control logic may continue these shift and storing operations until all chunks in all arrays have been configured, and all pointers have been stored.

It should be noted that if the shifted pointer in any of the chunks itself points to a new bad column address, the control logic can simply increment the pointer until the pointer identifies a functional memory location. If subsequent memory locations are bad during a subsequent register read operation, the data is simply read from the next sequential location as the prior operation has assured that sufficient memory has been allocated for each chunk.

It should also be noted that the above example is merely one possible memory configurations. Other memory configurations may be used. For example, some flash storage dies are configured such that the redundancy column are not provided for in one oversized column. Instead, in one configuration the redundancy columns are located at the end of a column. An example of this configuration, and the processing of the address information on an exemplary memory array is set forth in FIG. 8 below. In short, various memory configurations are available, and the control logic may perform different types of calculations than described above, without departing from the scope of the present disclosure.

The above-described processes, however, all take advantage of the conventional fact that non-volatile memory is equipped with supplementary memory locations for redundancy purposes in the generally inevitable event that one or more existing memory locations are bad or corrupted. In other embodiments as discussed, the redundancy columns are located at the end of an array (e.g., a plane). Regardless of the memory configuration, and regardless of how the pointers are manipulated to correctly allocate memory locations, these operations can now be performed at POR, only once on initialization.

Aspects of the present disclosure provide significant benefits over conventional implementations. As one such example, every time a conventional register read is performed, existing storage devices are required to calculate the relevant pointer offset on the fly, thereby resulting in the time delays described above. An exacerbating fact is that these required calculations are associated with every current register read, which may also lead to redundant calculations of the same information.

When a register read instruction is received using conventional techniques, the controller may look up the corresponding address in a ROM block. The data may be decoded in the ROM block, and identified to determine the number and location of relevant bad address locations. An offset to the correct memory location may be determined and then provided during the read. Every time a register read instruction occurs, the controller may conventionally perform this check to determine whether the column address is valid. As noted, for multiple conventional register reads, multiple corresponding delay periods occur, which can substantially reduce data capacity and overall bandwidth. With the aspects of the disclosed storage devices, by contrast, the allocation of physical memory locations for all memory arrays of a storage device may occur once at the outset, after which register read operations no longer require the long delay periods with which they are currently associated. The result is increased overall data capacity and substantially reduced read latencies. The POR procedure only has to be repeated if the storage device is shut-down or reinitiated.

The control logic referenced above may constitute dedicated special-purpose hardware (e.g. combinational logic (RTL, R2R, etc.), digital signal processors (DSPs), application-specific integrated circuits (ASICs), field programmable gate arrays (FPGAs), reduced instruction set (RISC) processors, and the like), in other embodiments the control logic may apply to one or more general purpose processors and/or to firmware to perform aspects and variations of the above-described procedures. Thus, control logic for purposes of this disclosure is intended to be interpreted broadly to include each of these possible mechanisms. In one embodiment, control logic includes hardware logic generated using a hardware translation language. However, as described in this paragraph, this need not be the case and other types of hardware, firmware, and/or software may qualify as "control logic" for the purposes of this disclosure.

Thus, in one embodiment, a circuit technique allows the memory device to perform the necessary calculations for identifying physical locations based on logical column addresses in the initial power-on-read (POR) operation (or synonymous power-up procedure performed in other types of storage devices) that are ordinarily performed in or near real time.

In various embodiments as described in more detail in the figures to follow, two sets of registers may be added along with multiplexers. For example, first registers may include multiple sets of registers for identifying prefixed starting addresses. This data may be used, as described above, to identify the starting addresses of each chunk within an array. Second registers may include column redundancy (CRD) point registers used to store pointer values (pointers), or offsets from a starting address as described herein. It will be appreciated that the size and number of the first and second sets of registers can vary based on the configuration of the memory. These considerations involve factors like the type of non-volatile memory, the number of planes and blocks, the page size, the number of bits used for error correction (ECC), and more generally, how the storage device is partitioned and configured. In some embodiments, the first and second registers are combined into a single register set used for both purposes.

In an exemplary, non-limiting embodiment, a storage device may include four planes, with each plane being configured to include four chunks of consecutive address locations. The first registers may be configured to include four sets of registers, with each set storing a prefixed starting column address, with each prefixed starting column address corresponding to one of the four chunks within a plane. The storage device may further be configured such that the second registers include sixteen (16) sets of registers, with four sets of registers per plane for storing respective pointer values. These numbers may vary for different embodiments.

In various embodiments, a multiplexer (MUX) may be used to select one of the four prefixed starting addresses. The MUX can be used by the storage device, whether by itself or in conjunction with other information, to identify the starting column addresses of one of the four chunks. A second MUX may be used to select one of sixteen calculated pointer offsets in total, or one of four pointer offsets corresponding to the plane selected using the first registers. The prefixed starting address, along with the relevant offset corresponding to a register read operation can then be sent via CRD logic or the on-die controller to identify the data latches corresponding to the requested data.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, Hiper-LAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
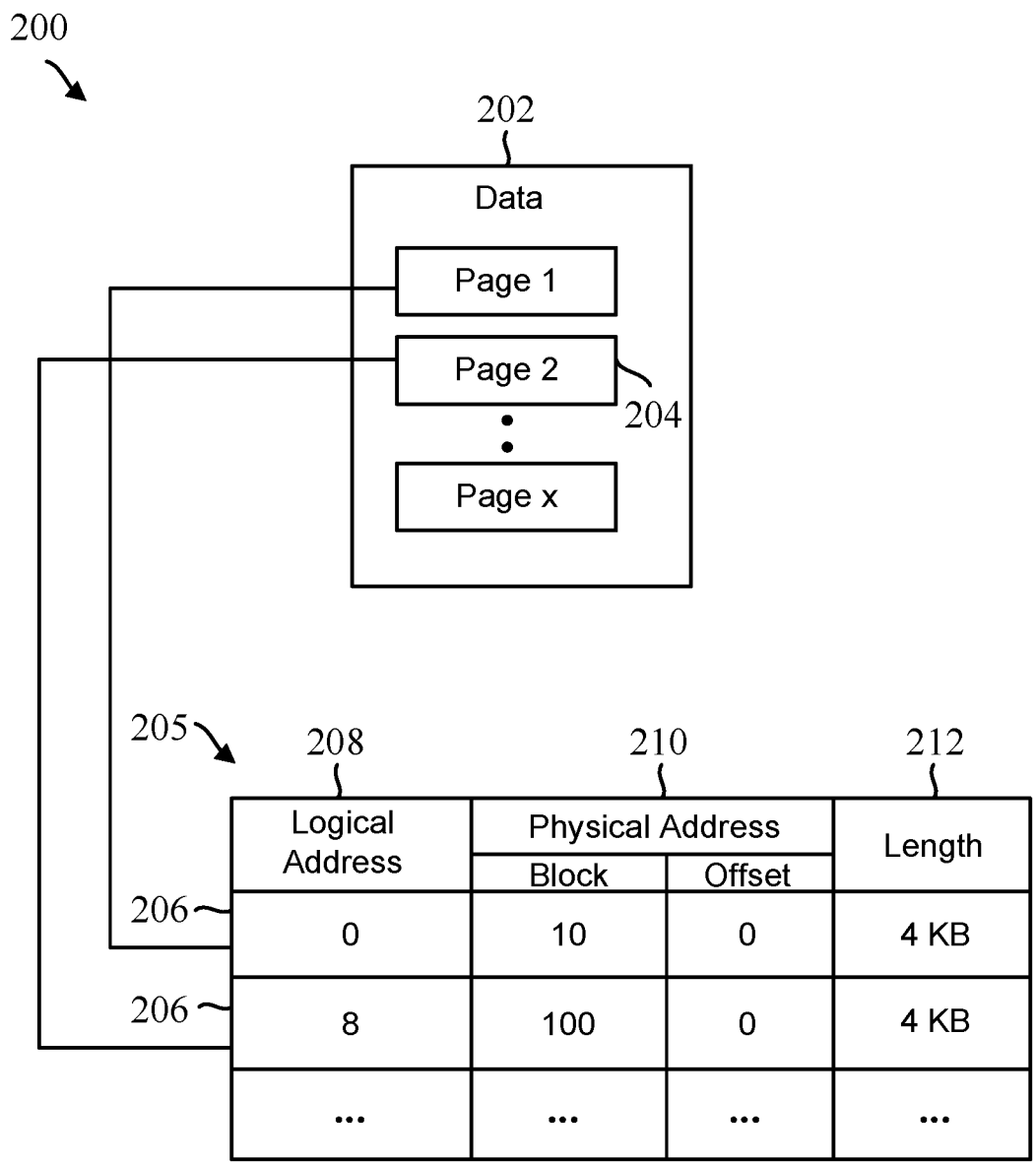
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size). While the mapping table 205 may be generally applicable to read and write operations, in various embodiments, an identical or similar such mapping table may be used in connection with mapping logical-to-physical addresses for data latches. A table of the form in FIG. 2 may be used for identifying logical-to-physical mappings during the latter portion of the POR procedure described herein.

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. Conventionally, if a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. The data latches may in some embodiments include XDL latches. The XDL latches may be used as cache memory for purposes of the storage device described herein. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
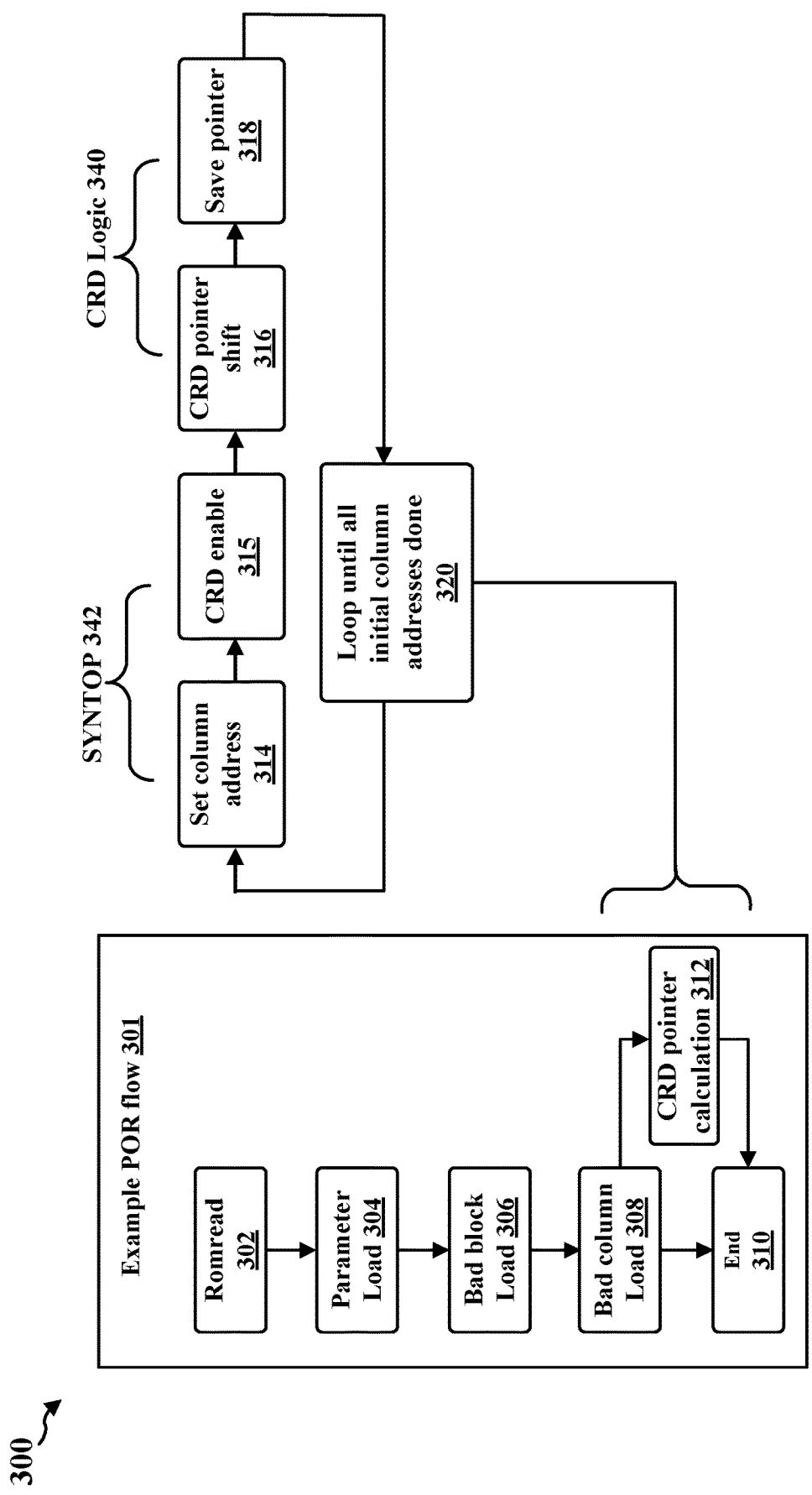
FIG. 3 is a conceptual block diagram and exemplary logic flow for performing column redundancy calculations.

FIG. 3 is a conceptual diagram 300 of circuits and an exemplary logic flow for performing column redundancy (CRD) calculations. As shown, two circuit elements SYNTOP 342 and CRD logic 340 may be included as hardware additions for use in performing the CRD pointer calculations 312 during the latter stages of POR, a shown in the Example POR flow 301. It is noted that, in other embodiments such as in different types of non-volatile flash memory, the POR process may be identified by a different label. However, such alternative devices typically provide analogous features including an initial identification of bad physical addresses and an identification of pointers to new physical locations. The present disclosure is intended to capture these features, and the POR operations can be analogously performed on different types of storage configurations. Thus the principles disclosed herein may apply with equal force to these alternative flash-based storage technologies, which are intended to fall within the spirit and scope of the present disclosure.

Figure 4:
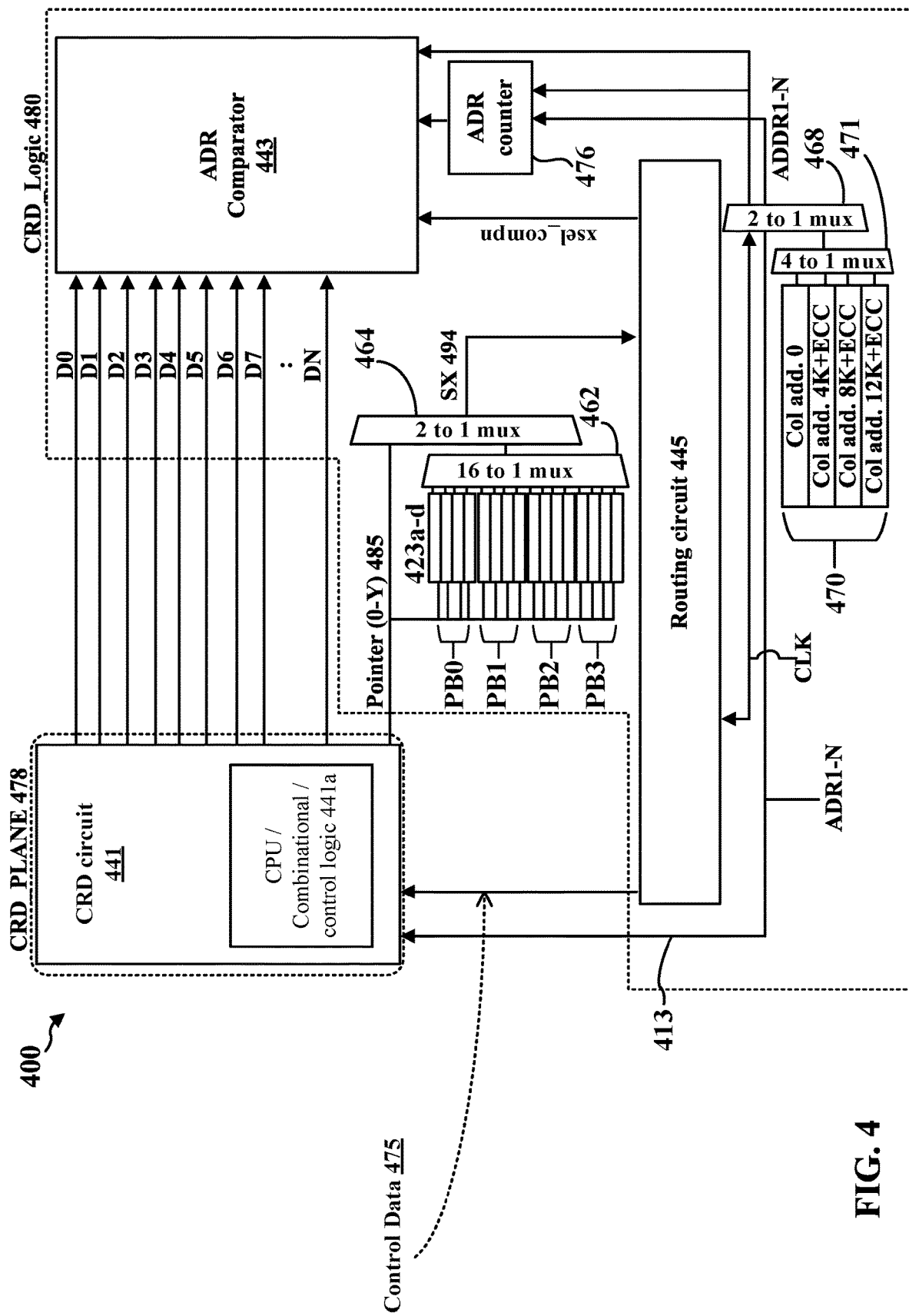
FIG. 4 is a conceptual diagram of a circuit block for performing column redundancy calculations during a power-on-read operation.

SYNTOP 342 may set a column address 314 for use in a calculation, which may be derived from a pre-fixed starting column address or an address initialized on startup and stored in a suitable register (see FIG. 4). Typically, the column address 314 set by SYNTOP 342 is the next one in line for identifying a relevant pointer offset to account for any bad address locations. For example, the set pre-fixed column address 314 may be a hardware or functional block used to reference a starting portion of a chunk, page, block, word, or other memory unit within an array or plane. CRD enable 315 may be activated to identify to the system that the control logic is currently performing column redundancy adjustments to account for bad column addresses, for example. If the column address 314 is set to a first address in an array and the CRD 315 is enabled, the then the CRD logic 340 may calculate any necessary pointer offsets based on bad addresses using the functional block CRD pointer shift 316. It is noted that in a typical POR flow 301, after an initial ROM read 302 and parameter load 304 for setup purposes, the bad block load 306 may be used to identify bad column addresses. Typically, bad columns are identified in a wafer or die during fabrication, and are included in a dedicated region of the die. The bad blocks or columns may respectively be identified in bad block load (306) (identifying a corrupt memory block), or a bad column load (308) (identifying a bad memory location). If the first prefixed column address references a good memory location, then the CRD pointer shift 316 may simply be configured to point to (or stay at) a non-shifted value corresponding to the same address. The CRD logic 340 saves the value of the pointer 318 in an available register.

As described more fully below, the CRD pointer calculations 312 in accordance with some embodiments "loop" or repeat until all the initial column addresses for all planes or arrays are complete (320). After the first prefixed column address, the controller/control logic may then set the next column address (314) corresponding to the next chunk or block in the plane or array. In this embodiment, CRD may be enabled (315), in which the CRD pointer shift 316 may offset the pointer by the total number of relevant bad columns identified from block 308. The CRD logic 340 uses the Save pointer block 318 to save the pointer in a corresponding register. This loop is repeated until pointers for each block of each of the pre-fixed starting addresses is completed. As applicable, the next plane or array starting address can be set, and calculations can resume for the chunks in that array. After all arrays are duly configured, POR can end as shown in block 310, and the die is ready for normal operation.

Referring still to FIG. 3, the Save pointer block 318 can thereafter be referenced for subsequent register reads using the relevant registers in which the offsets were stored. The value for a given starting address provided by a user may be obtained based on the prefixed address and the stored pointers without the need for further calculations. The time twhr2 can be significantly reduced, if not eliminated altogether.

FIG. 4 is a conceptual diagram of a circuit block 400 for performing column redundancy calculations during a POR operation, and for providing and controlling various addressing operations during normal operation of the storage device. The illustration includes a CRD plane 478, which includes CRD latch circuit 441. For purposes of this embodiment, CRD circuit 441 may be used to store up to some integer N number of bad column addresses per plane, and in practice, different capacities and N values are possible. (Column addresses for the cache memory as described herein may include the addresses from the A1, A2 fields that can be sent with a register read instruction.) The CRD circuit may, for example, store the bad column information of N words per plane, for example using a preconfigured array of columns and rows that accommodates the N words.

In various embodiments, such as the embodiment of FIG. 4, the data path used by the controller to calculate offsets can be shared among the different planes of the storage device, which helps to minimize the total die area used for these calculations. The logic circuits described in FIG. 4 can also be shared and selectively used for calculations in the different planes. The CRD address registers (e.g., registers 423a-d) are unique for each plane, and multiplexing techniques (such as those described herein) can be used to selectively store or retrieve the correct data for a given plane, as necessary. Thus, while the pointer offset calculations in these embodiments may be performed sequentially during POR as described below, the calculations beneficially do not require excessive area on the die to accommodate different data paths. In other embodiments, dedicated circuits and data paths for each plane may be used, albeit at the cost of substantial increases in die area.

The bad column addresses may be output during POR using a plurality of N-bit outputs D0-DN to an address comparator circuit 443 such that, for example, the bad column address may conventionally be provided to the comparator circuit to compare it to the column address being provided by the storage controller (FIG. 1). Address comparator circuit 443 may also receive, during ordinary operation, the selected prefixed column address from first registers 470 via the functional block ADR counter 476, along with other control signals. Together with the routing circuit 445 and the CRD clock input CLK, the ADR address comparator 443 may be used to control various addressing functions of the circuit 400.

The CRD circuit 441 may also include control logic 441a, including the SYNTOP circuits 342 and the CRD logic 340 described with reference to FIG. 3. For exemplary purposes, the circuit 400 may be configured to control a four-plane flash memory that uses four logical chunks with four starting addresses in each plane. In this embodiment, the four prefixed starting addresses for each column may be stored in first registers 470. Further, for purposes of this example, each plane may be represented as a series of consecutively-positioned column address locations having a total of 16 Kilobytes of data plus ECC in four 4 KB chunks, although larger or smaller amounts are also possible. Thus, a user can issue register reads in this embodiment by providing one of four starting addresses—e.g., a "0" address (for use with a first chunk of 0-4 kilobytes (K)), a column 4K address (for a second chunk of 4K-8K), a column 8K address (for a third chunk of 8K-12K), and a column 12K address (for a fourth chunk of 12K-16K). The prefixed starting address can be used for addressing one of four chunks within the four planes, both in regular operation of the circuit 400, and in the POR procedure described herein.

Shown as 423a-d, respectively, are four sets PB0, PB1, PB2 and PB3 of registers, four per plane, which may be used to store pointer values that are calculated using control logic 441a during POR. Registers 423a-d are also used in ordinary operation to identify the correct physical memory locations (e.g., offsets) that correspond to the logical column addresses input at ADR1-N. Thus, for example, the column address information (A1, A2) in ADR1-N from the storage controller may be used to select the corresponding prefixed starting address stored in first registers 470. The control logic 441a and the second registers 423a-d may be used to calculate and store the pointers to the physical memory locations corresponding with the column addresses. Y-bit output Pointer 485 may be used during the POR stage to output the calculated physical memory locations/offsets and to store the information in an applicable one of the second registers PB0-PB4. Also, the input address signal ADR1-N as well as various control signals 475 obtained from routing circuit 445 may be provided to the control logic for use in operation of the storage device.

Figure 5:
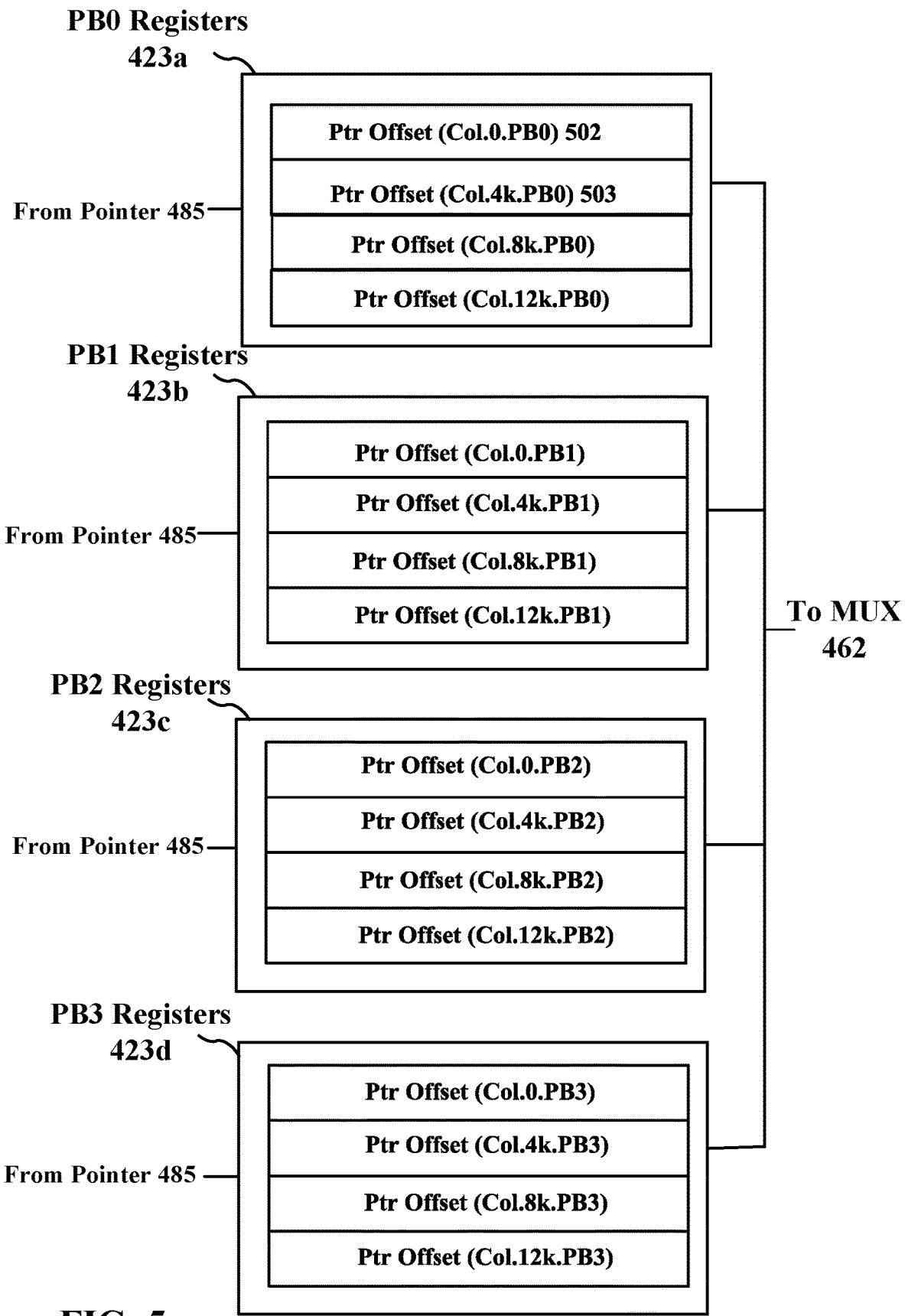
FIG. 5 is a block diagram of the registers of FIG. 3 for storing offset data for identifying physical memory location.

FIG. 5 is a block diagram of the registers of FIG. 4 for storing offset data for identifying physical memory locations. In this example, each of the four sets of registers in 423a-d includes four separate entries for the four chunks within the plane. Each of the entries, such as PB1 register 423b, entry Ptr Offset (Col.4k.PB1) stores an offset that identifies a physical address location of the 4K column associated with the second chunk in the second plane PB1. Once the CRD process is complete at the end of POR, each of the register entries 423a-B is populated with pointers to correct physical locations in memory (see, e.g., FIGS. 6-8) that can be used immediately during a register read operation. In this exemplary embodiment, a total of sixteen register entries may be used for providing offsets. The prefixed starting address selected from the first registers based on the ADR1-N input may be used during regular operation to identify which of four blocks PB0-PB4 of the second registers are being addressed at a given time.

Referring back to FIG. 4, the first registers 470 include MUXES 471 and 468. The MUX 471 may be used during regular operation to select a particular prefixed starting address based on the values obtained from the ADR1-N input. In addition, in another embodiment, the circuit 400 may include a second MUX 468. MUX 468 is a second MUX that may be used in some embodiments to ensure backward compatibility. For example, MUX 468 may be used to select one of the prefixed column addresses in first registers 470, which may then be passed to the comparator circuit 443 for use in the register read operations. Alternatively, MUX 468 may be set to backward-compatibility mode, in which case MUX 468 may select the input ADR1-N from the storage controller to be sent directly to the ADR comparator circuit 443. The configurations shown are exemplary in nature, and other possible embodiments using different or additional circuit elements are also possible.

In addition, associated with second registers 423a-d is a 16 to 1 MUX 462. During ordinary operation where the pointer results and correct physical memory locations for the data latches have been pre-calculated and stored, MUX 462 may be used to select an applicable one of the sixteen values to reference a correct memory location for the chunk currently being accessed at any given time. In still another embodiment, another MUX 464, in this case a 2-1 MUX 464, may be placed at the output of MUX 462. Concurrent with MUX 468, MUX 464 may be used to ensure backward compatibility. Thus, to allow the legacy real time calculation of offset values, MUX 464 can be used to directly select Pointer 485, which can then calculate the shift value over the legacy time interval twhr2 and thereafter provide the correct value via the SX 494 signal to the circuit 445 for processing the shift value and sending it to comparator 443.

In cases where the pointer values are stored in the second registers 423a-d, they may be instead available immediately via MUXES 462 and 464 to the circuits 445 and 443. The shifted memory locations may be calculated using the control logic 441a and stored in the applicable pointers, as described in greater detail below.

While FIGS. 4 and 5 reference a specific number of planes and memory chunks, along with a circuit configuration of logic blocks, MUXES, and registers, it will be appreciated by those skilled in the art upon review of this disclosure that the values and circuits are exemplary in nature. A number of different circuit configurations, including a different register and MUX configuration, and a different number and partitioning of planes and corresponding chunks (including blocks, pages, or other divisions) may be contemplated without departing from the spirit and scope of the present disclosure. In addition, as noted above, the control logic 443a may in some embodiments be configured as one or more software routines having instructions executed in a general purpose processor, or control logic 441a may use another type of hardware, firmware or software configuration.

Figure 6:
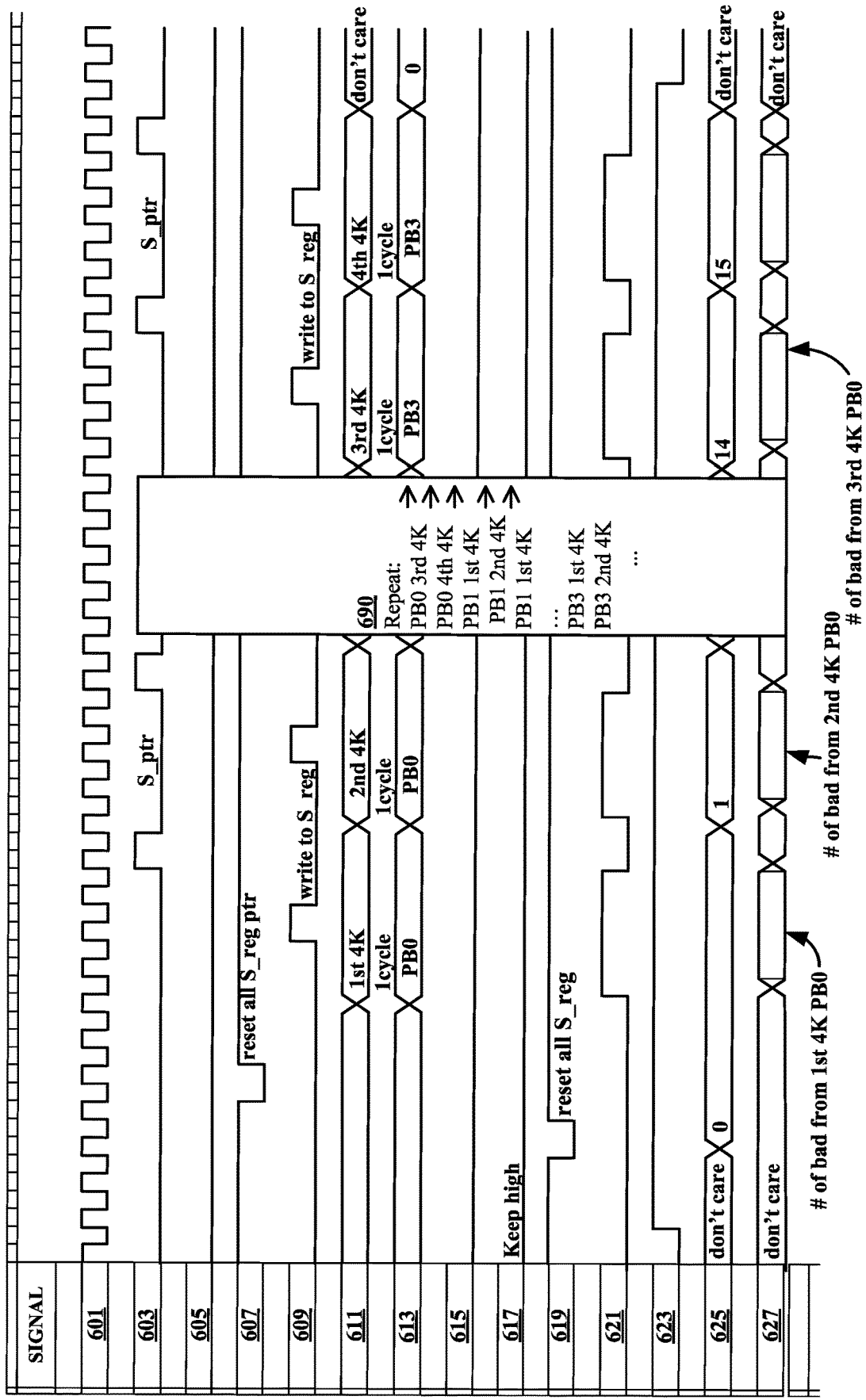
FIG. 6 is a timing diagram illustrating an example of column redundancy-based calculations during a power-on-read operation.

FIG. 6 is a timing diagram 600 illustrating an example of column redundancy-based calculations during a power-on-read operation. The identified signals may be included in the SYNTOP circuit blocks 342 and the CRD logic blocks 340 identified in FIG. 3, with certain of the signals also being illustrated in FIG. 4. In general, clock signal 601 may be used in some embodiments to drive the CRD_CLK in FIG. 4. Clock 601 and may be used for timing the various operations including for synchronous circuits within the control logic 443. Signals 607 and 619 may be used to ensure that certain values in the S register pointer (e.g., second registers 423a-d) are properly reset and initialized prior to calculating and storing their values during POR, or in some embodiments to reset control logic 441a, prior to using the control logic 441a to sequentially populate the registers 423a-d with offset pointers. Signal 611 represents the address signals on ADR1-N of FIG. 4. Signals 605, 615, and 617 include different control or enable signals for various circuits included within the SYNTOP circuit blocks 342.

Signal 625 may be used for identifying one of sixteen register values for writing offset values. Signal 627 may include the Y-bit offset signal calculated using the control logic 441a. Signal 613 uses a data field to identify one of the four applicable blocks PB0-PB4 for writing the pointer offset values identified by the signal 627. In general, after the bad columns are identified during a POR operation, FIG. 6 shows the first two writes (PB0 $1^{st}$ 4K and PB0 $2^{nd}$ 4K) and the last two writes (PB3 $3^{rd}$ 4K and PB3 $4^{th}$ 4K) of calculated pointer information into the first two column addresses of PB0 (signals 611, 613) and the last two column addresses of PB3. The text in the block 690 indicates that the writing process is repeated in between the two beginning writes and two ending writes, in total sixteen times for each calculation of a shifted pointer value. This information is read into registers 423a-d (FIGS. 4 and 5) after it is determined. When signal 609 goes high, for example, the calculated pointer from signal 627 is read into the applicable register of the sixteen registers 423a-d, depending on the plane/array and the column being addressed.

After POR and during regular operation of the storage device, register reads can be quickly effected by the use of one of the prefixed column addresses in the first registers 470 and a corresponding pointer shift in an applicable one of the second registers 423a-d as identified by the prefixed column address.

Figure 7:
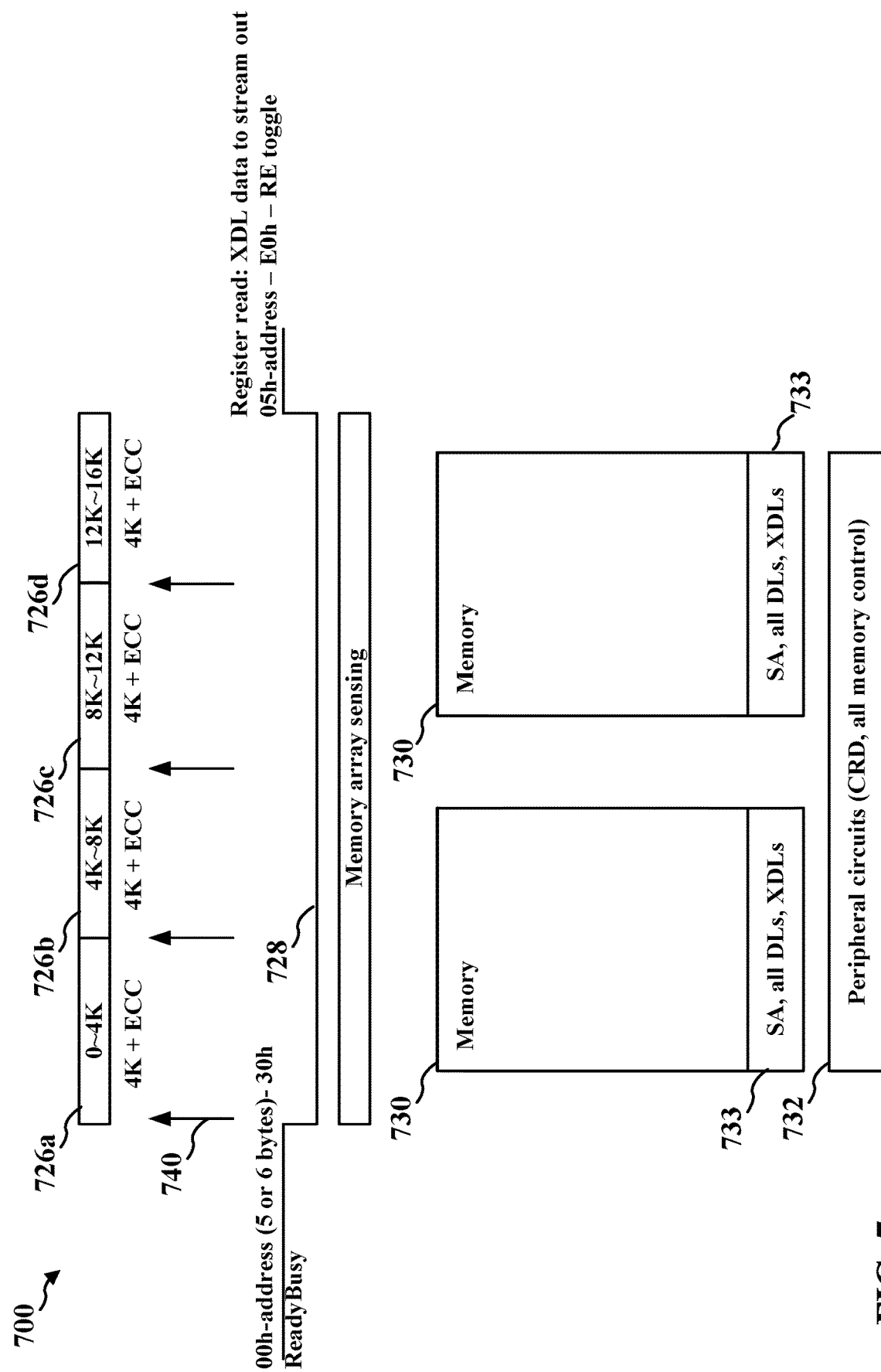
FIG. 7 is a conceptual diagram illustrating an example of a memory configuration for use in a register read operation.

FIG. 7 is a conceptual diagram illustrating an example of a memory configuration 700 for use in a register read operation. In the example shown, blocks 730 include two exemplary NAND storage arrays. Each of the sense amplifiers, including the data latches and XDL latches 733 are coupled to respective word lines of the memory. In an embodiment, XDL data latch corresponds to the latch circuit that functions as the cache memory for the NAND arrays 730. The peripheral circuits 732, including the circuits of FIGS. 3 and 4 and the other memory control circuits, can be included on the same die adjacent the sense amplifiers 733 and memory blocks 730. The above portion 726a-d shows an exemplary array of memory chunks. The memory chunks are not intended to represent positions on the die relative to memory 730, but rather are intended to conceptually illustrate an exemplary sequence of columns. The readyBusy signal is a control signal which, when asserted low, indicates that the storage device is busy with a read operation. If the pointer values for the start of each chunk (including ECC in one embodiment) are not configured during POR, then the user must wait during a time period 728 before the XDL data from a corresponding register read is available to toggle on the I/O bus. As described above, in FIG. 7, each chunk of data in 726a-d may not include merely the data, but also may include ECC and other fields that may optionally be included. Here, an exemplary additional number of bytes is included for each individual chunk. The amount of ECC may vary depending on the implementation.

Figure 8:
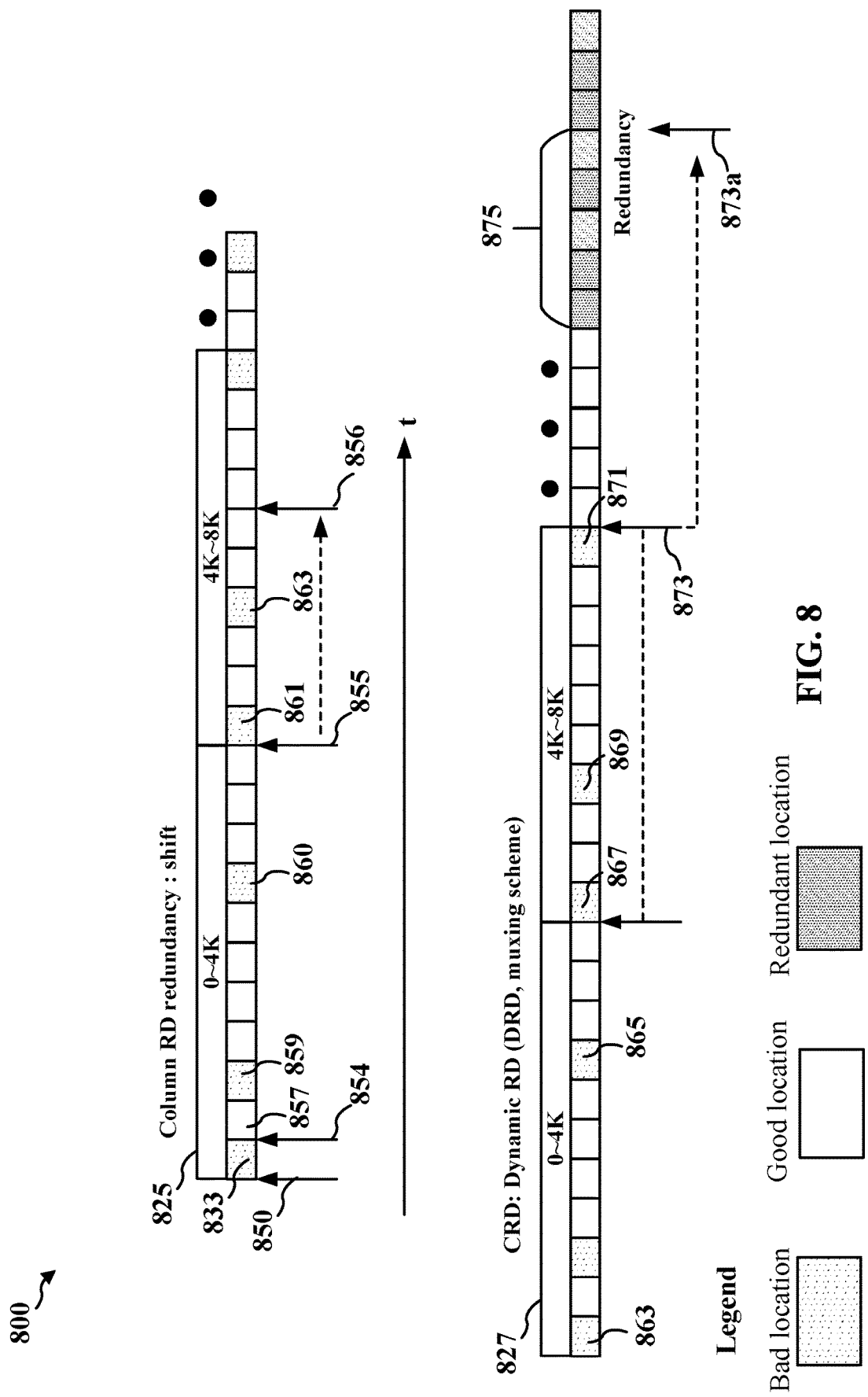
FIG. 8 is a conceptual illustration of allocating physical memory locations during a power-on-read operation.

FIG. 8 is a conceptual illustration 800 of methods for allocating physical memory locations during a power-on-read operation. While FIG. 8 shows two examples, other configurations are possible and may be implemented during POR using analogous techniques.

In an exemplary embodiment, the control logic 441a is calculating pointers for array PB0. The three dots represent that the column may continue with additional chunks. It is assumed that the bad address locations have already been identified during the bad column load 308 in POR (FIG. 3). In a first embodiment 825, the control logic 441a (FIG. 4) may be directed to analyze four different arrays, for example, based on the usual four different prefixed column addresses, for a total of sixteen pointer offsets. The first embodiment is configured to include a pre-set number of "extra" memory locations in the column to ensure that the circuit can allocate a sufficient number of memory locations to each chunk in an array, up to the number included in the manufacturer's specifications for the die.

In a first embodiment, it is assumed that the system has been recently powered on and during the POR, the bad columns have been identified. The horizontal time axis is generally intended to show that the sequence of events occurs from the left to the right. Thus SYNTOP 342 (FIG. 3) sets a column address 314 corresponding to the prefixed starting address for the first chunk in the first plane. The embodiment shown is intended to include a plurality of consecutively-positioned columns of memory ranging from 0 to 16K in 4K segments.

The below description characterizes events that may occur in a certain order. Unless the timing otherwise dictates, the order of events described is exemplary in nature, and the operations may proceed in a different order than that described to obtain substantially the same result, without departing from the principles herein.

Starting with PB0 as in FIGS. 4 and 5, the control logic 441a may read the prefixed column address and identify the associated physical memory location as 833. The pointer 850 in FIG. 8 is therefore at an initial location corresponding to the set column address. As identified by the legend on the lower left of FIG. 8, it is assumed in this embodiment that physical location 833 corresponds to a bad memory location. The pointer 850 is therefore shifted by one such that a subsequent location of the pointer is 854, which corresponds to good memory location 857. The control logic 441a thus stores the pointer 854 corresponding to the starting address of first chunk PB0 to refer to physical memory location 854. For example, this pointer 854 may be stored in a corresponding location Ptr Offset 502 of the second registers 423a (FIG. 5).

The SYNTOP 342 may next identify the column address from the pre-fixed column address corresponding to the PB0 4K entry in the same plane—namely, at 855. Accordingly, as the control logic 441a may count the total number of bad addresses starting from the location corresponding to pointer 854 to the location 855 corresponding to memory location 861. The objective in this embodiment is to shift the pointer from the prefixed starting address 855 to a value that ensures that the chunk PB0 is allocated the specified number of good memory locations (e.g., (4 KB)) plus the number of allocated ECC locations needed. The control logic 441a in this example identifies two bad memory locations 859 and 860. Accordingly, to correctly set the initial pointer value for the PB0 4K chunk, the pointer at 855 may shift its value by an offset that compensates for the two bad memory locations. In addition, the control logic at pointer 855 identifies that it is currently pointing to a bad location 861, which it must add to the two bad values encountered in PB0. The control logic shifts the pointer 855 in this configuration by the two bad locations 859 and 860 and also by the two bad locations 861 and 863 (the latter of which may be identified during the shift). Thus, for purposes of this example, the pointer 855 is shifted by a total of six memory locations, or four good locations, to its new location at block 856. The control logic, noting that the memory location corresponding to pointer 856 is a good location, stores the pointer to Ptr Offset 503 in the PB0 register (FIG. 5).

It is noted that the control logic took into account the number of bad physical memory locations preceding the memory location corresponding to the 4K starting address. This information was necessary in this embodiment to ensure that PB0 was allocated a correct number of functional memory locations, thereby removing the bad memory locations from the total number. As the control logic calculates the remaining pointers for the 8K and 12K chunks, it likewise takes into account the number of respective preceding bad memory locations in order to ensure that each memory chunk is allocated the full 4K+ECC, or other specified value.

After setting the pointers for all four chunks in the plane, the control logic proceeds to the remaining planes and performs the same analysis for the corresponding memory locations.

In some embodiments, the column redundancy locations are provided at the end of a column, instead of the example of 825 in which an extra number of columns is generally provided for compensatory purposes, as in the first example in FIG. 8. Configuration 427 shows an example of such a configuration. Referring to the configuration 827, it is assumed for simplicity that each chunk is allocated exactly 4K (plus ECC). In this example, it is also assumed that the control logic is evaluating the PB3 entries and in particular, it is evaluating a pointer corresponding to the beginning of an 8K chunk. The shadowed memory locations correspond to the redundancy locations used in this example. The control logic 441a may compute that five bad locations 863, 865, 867, 869 and 871 precede the current location corresponding to pointer 873. Thus the pointer 873 is assigned a value that points to a total of five redundant memory locations, at 873a. Thus, the five redundant locations 875 are used to substitute for bad locations 863, 865, 867, 869 and 871. The pointer 873a may be stored to identify these memory locations, which may be consecutively addressed during subsequent register read operation.

While two examples of memory configurations are demonstrated in FIG. 8, the principles of the present disclosure can be used in connection with a large number of different available memory configurations and different memory capacities.

FIG. 9 is an exemplary flow diagram illustrating a memory pre-configuration for use in subsequent read operations. At 902, a prefixed starting address is stored in first registers 470 corresponding to one or more memory arrays. Thereupon, at 904 and based on values previously determined during wafer production, the controller identifies all of the bad physical address locations/blocks in each array.

Thereafter, a first column address corresponding to a first chunk of a first array is provided. At 906, the controller may determine, for each successive chunk in each array, a pointer value to a suitable memory location and may store that value in a corresponding register of second registers 423a-d. As shown in block 910, the control logic loops around for each chunk of each array until all necessary pointer values have been assigned in a manner that ensures an allocated amount of functional memory locations for each chunk. After the completion of POR at 912, the storage device is set until the next shutdown. The storage controller can use the pre-stored pointer values in conjunction with the prefixed column addresses to identify any location in cache memory, and to do so without the latency traditionally associated with calculating this information on the fly.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   one or more memory arrays each comprising a plurality of chunks, each chunk comprising a plurality of consecutive memory locations;
   first registers configured to store a prefixed starting address for each chunk; and
   control logic configured, during a power-on-read (POR) operation, to:
      identify bad physical address locations in each array;
      determine, for each chunk in an array based on the prefixed starting address and the bad physical address locations, a pointer to a starting physical address; and
      store the pointer in second registers for use in register read operations.

2. The device of claim 1, wherein the control logic is further configured to shift a pointer to a memory location in a chunk based on a number of bad physical addresses in an array that precede the memory location.

3. The device of claim 1, wherein:
   each chunk includes a plurality of redundant memory locations arranged sequentially after the last chunk and configured to replace a bad physical address location in the chunk; and
   the pointer to the bad physical address location is shifted to point to a next available one of the redundant memory locations.

4. The device of claim 1, wherein the memory locations comprise memory cells arranged on a substrate in columns, and the addresses comprise column addresses.

5. The device of claim 1, wherein the control logic is further configured to:
   receive a register read instruction and a logical address from a storage controller; and
   retrieve the requested data from latch circuits in the memory array using the corresponding prefixed starting address and corresponding stored pointer.

6. The device of claim 5, wherein the latch circuits comprise X-data latch (XDL) circuits.

7. The die of claim 5, further comprising a second multiplexer coupled to an output of the second registers and configured to select a stored pointer corresponding to an address included with a register read.

8. The device of claim 1, further comprising a first multiplexer configured to select one of the pre-fixed starting addresses based on the identified address information received in a register read operation.

9. The device of claim 8, further comprising a second multiplexer configured to select one of the stored pointer values from the second registers for use with the selected pre-fixed starting address to determine a physical location of data based on address information received in a register read operation.

10. The device of claim 9, further comprising:
    a third multiplexer coupled to an output of the first multiplexer and a logical address input; and
    a fourth multiplexer coupled to an output of the second multiplexer and an output of the control logic, the third and fourth multiplexers being configured to provide backward compatibility for calculating a pointer during a pending register read operation.

11. The device of claim 1, wherein
    the array comprises a memory plane, and
    each of the prefixed starting addresses are shared for use with each of the planes.

12. The device of claim 1, wherein each of the prefixed starting addresses includes an allocated number of bits for error correction code (ECC).

13. The device of claim 1, wherein each of the consecutive memory locations comprises a plurality of dedicated redundancy memory locations at an end for use in lieu of the bad physical address locations.

14. The die of claim 1, further comprising a first multiplexer coupled to an output of the first registers and configured to select one of the initial column addresses.

15. The die of claim 1, wherein each of the memory chunks is allocated additional bits for error correction code (ECC).

16. A storage device, comprising:
    one or more memory planes each partitioned into consecutive chunks, each chunk arranged as sequential columns of memory cells having a starting address stored in first registers; and
    control logic configured, during a power-on-read (POR) operation, to:
       identify information comprising bad physical addresses in each plane;
       determine, for each chunk in each plane based on the corresponding starting address and the bad physical address information, a pointer to a memory location; and
       store the pointers in second registers for use with the starting addresses in performing register reads.

17. The device of claim 16, wherein the control logic is further configured to determine the pointer for at least some of the chunks by shifting a value of the pointer by an amount corresponding to a number of bad physical addresses preceding a starting address of the at least some of the chunks.

18. The device of claim 16, wherein the memory cells comprise one of NAND flash or NOR flash memory.

19. The device of claim 16, wherein each of the chunks is allocated a preconfigured number of physical memory locations for use as error correction code (ECC).

20. A storage device, comprising:
- a plurality of consecutive memory chunks each arranged as columns of memory cells;
- first registers configured to store an initial column address for each chunk; and
- control logic configured, during a power-on-read (POR) operation, to:
  - identify bad physical addresses in each chunk;
  - retrieve, from the first registers for each successive chunk, the starting column address;
  - determine a pointer to a memory location for the initial column address for each block, wherein at least some of the pointers are shifted based on the bad physical addresses; and
  - store the pointers in second registers for use in register read operations.

\* \* \* \* \*